United States Patent
Frankowsky et al.

(10) Patent No.: US 6,845,554 B2
(45) Date of Patent: Jan. 25, 2005

(54) METHOD FOR CONNECTION OF CIRCUIT UNITS

(75) Inventors: Gerd Frankowsky, Hohenkirchen-Siegertsbrunn (DE); Harry Hedler, Germering (DE); Roland Irsigler, Munich (DE); Thorsten Meyer, Dresden (DE); Barbara Vasquez, Livermore, CA (US)

(73) Assignee: Infineon Technologies AG, München (DE)

(*) Notice: Subject to any disclaimer, the term of this patent is extended or adjusted under 35 U.S.C. 154(b) by 37 days.

(21) Appl. No.: 10/298,837

(22) Filed: Nov. 18, 2002

(65) Prior Publication Data

US 2003/0110628 A1 Jun. 19, 2003

(30) Foreign Application Priority Data

Nov. 22, 2001 (DE) .......................... 101 57 280

(51) Int. Cl.[7] .............................. H05K 3/30
(52) U.S. Cl. ............. 29/832; 29/740; 29/834; 29/835
(58) Field of Search .............. 29/740, 832, 834, 29/835, 833, 840, 846, 755

(56) References Cited

U.S. PATENT DOCUMENTS 5,634,267 A * 6/1997 Farnworth et al. ............ 29/840
5,640,762 A * 6/1997 Farnworth et al. ............ 29/833
5,796,264 A * 8/1998 Farnworth et al. .......... 324/758
6,219,908 B1 * 4/2001 Farnworth et al. ............ 29/833
2003/0110628 A1 * 6/2003 Frankowsky et al. ......... 29/846

FOREIGN PATENT DOCUMENTS

DE  195 07 547 C2  9/1996
DE  197 02 014 A1  4/1998
WO  WO 96/02071 A1  1/1996

OTHER PUBLICATIONS

Peter Van Zant, "Microchip Fabrication A Practical Guide to Semiconductor Processing," McGraw–Hill, 4th ed., A Division of The McGraw–Hill Companies (USA), p. 564, (2000).

* cited by examiner

Primary Examiner—Carl J. Arbes
(74) Attorney, Agent, or Firm—Jenkins, Wilson & Taylor, P.A.

(57) ABSTRACT

The invention creates a method for connection of circuit units (101a–10n) which are arranged on a wafer (100), in which the wafer (100) is fitted to a first film (102a), the wafer (100) is sawn such that the circuit units (101a–101n) which are arranged on the wafer (100) are separated, the functional circuit units (101d) are picked up by means of a handling device (101) and are placed down on a second film (102b) by means of the handling device (103), so as to produce a separation distance which can be predetermined between connection contacts of the circuit units (101d).

7 Claims, 3 Drawing Sheets

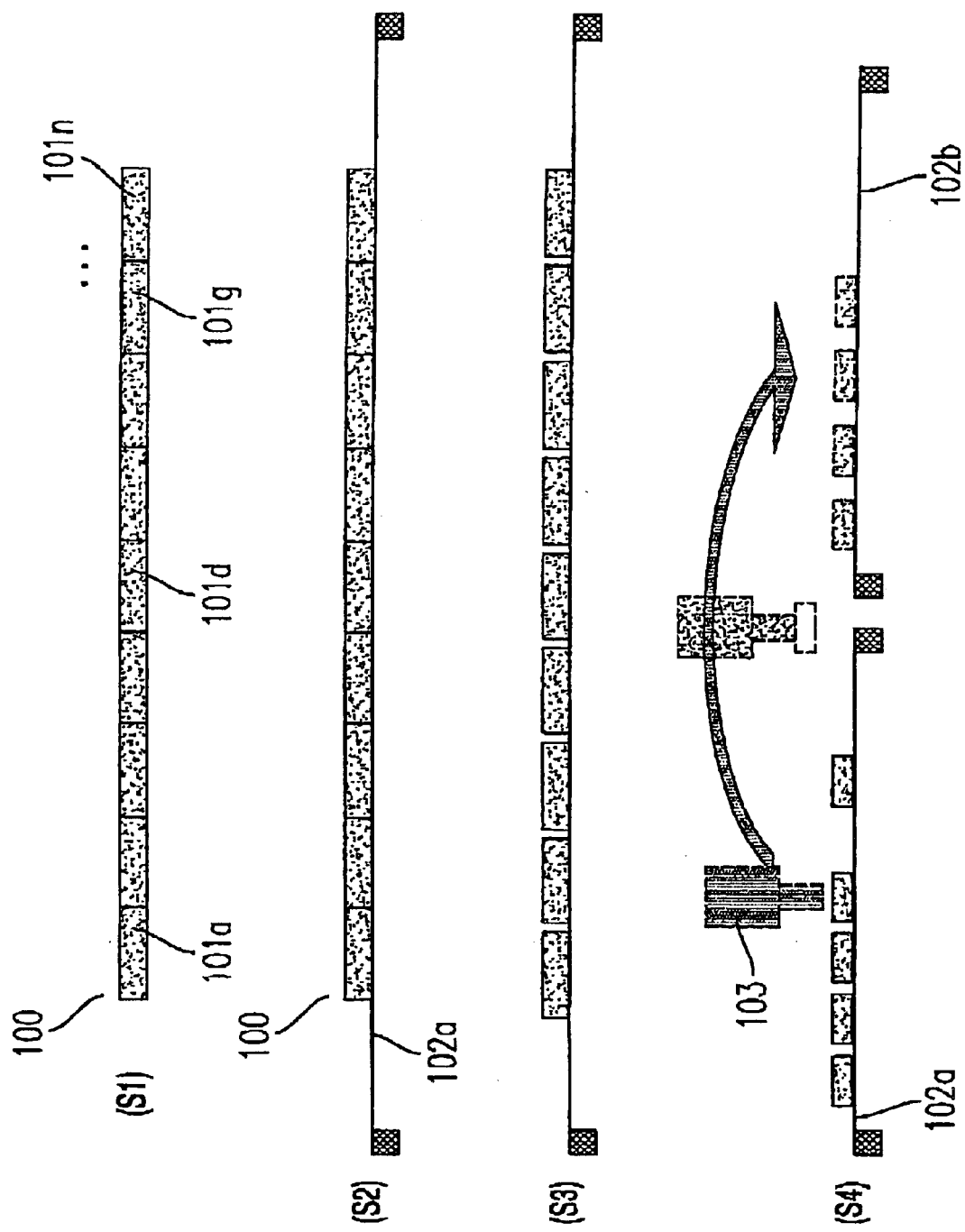

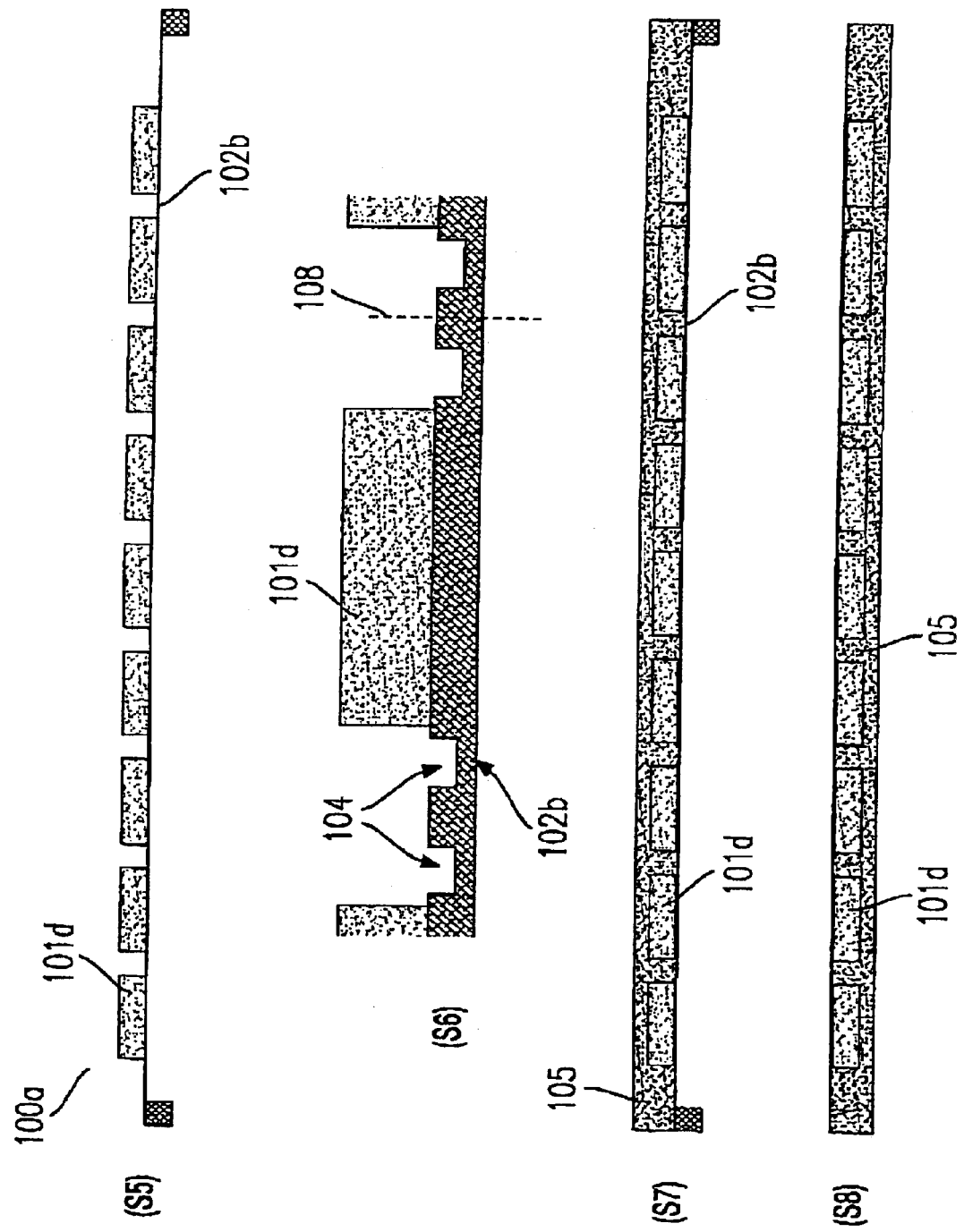

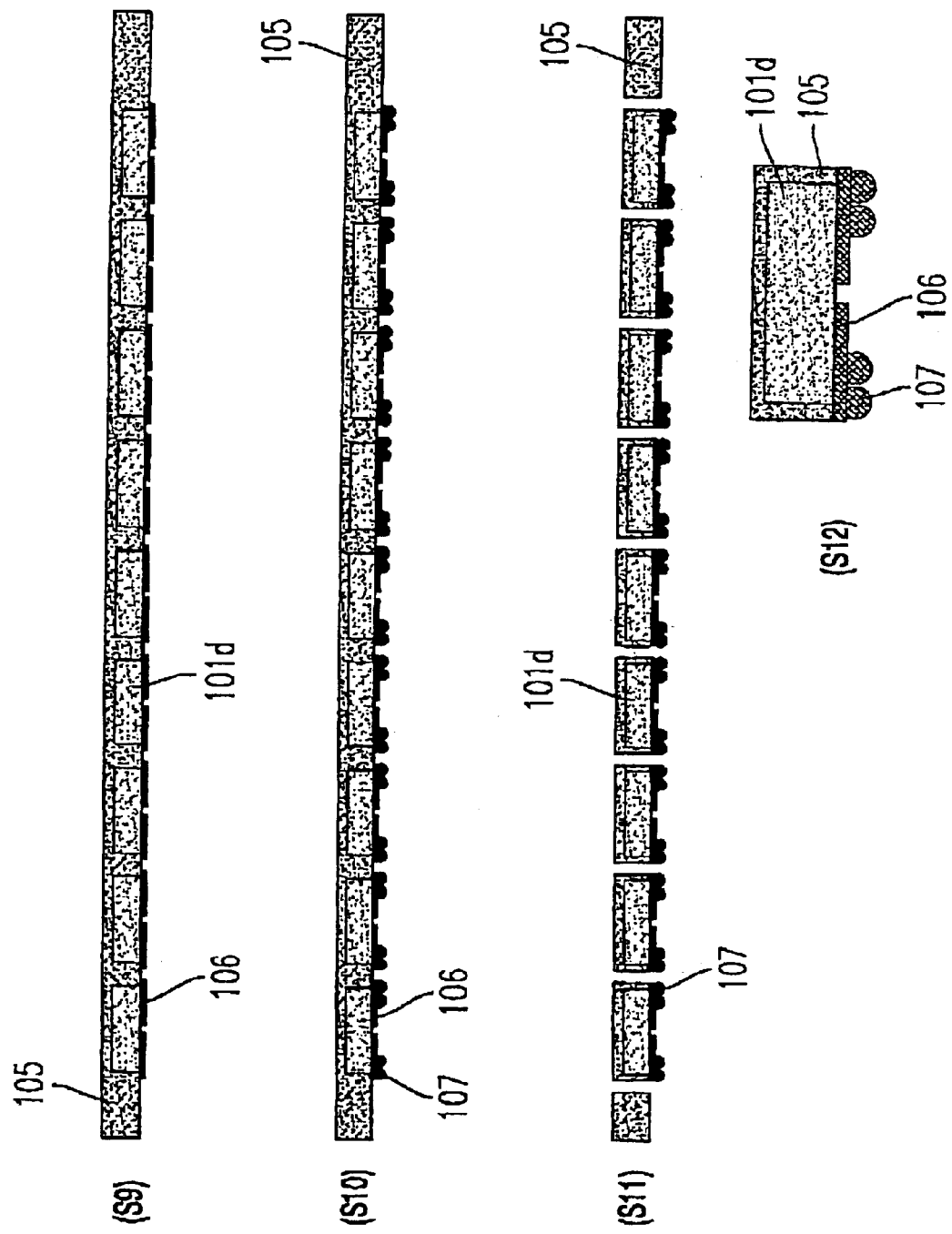

METHOD FOR CONNECTION OF CIRCUIT UNITS

TECHNICAL FIELD

The invention relates in general to a method for connection of circuit units, and relates in particular to a method in which functional circuit units can be separated from defective circuit units and in which, furthermore, the functional circuit units can be connected to contacts which are located outside the area occupied by the circuit units.

BACKGROUND ART

During a packaging process at the wafer level (wafer level packaging=WLP), it is necessary [lacuna] when package sizes correspond to the circuit units, that is to say when packages are designed for the size of the chips (chip size packages=CSP) and are manufactured only in the same size as the circuit units (that is to say the chip size). The circuit units or components to be fitted must in this case be soldered or bonded by one face at the bottom onto generally small solder or gold contacts on a printed circuit board or a module board, with no package being provided ("naked chip").

Once the circuit units have been mounted, all the connections of the circuit units are thus located on a lower surface of the chip face, that is to say in the "shadow" of the circuit unit (of the chip).

A major disadvantage of conventional methods for fitting circuit units is that, when there are a large number of connections, the distance between these connections (separation distance, pitch) must be reduced in order to accommodate all the connection units under a circuit unit or underneath a silicon surface of the circuit unit. This disadvantageously requires highly costly circuit boards.

A further disadvantage of the methods according to the prior art is that these circuit boards frequently do not comply with any Standard.

Conventional packages or casings for circuit units are therefore constructed using a so-called "fan-out design", which means that the connection contacts are not fitted directly underneath the lower face of the silicon surface of a chip (of the circuit unit), but that a so-called intermediate contact-making unit (interposer) is provided, whose base area is larger than the actual circuit unit to be fitted, so that it is possible to achieve a standard separation distance (a standard distance between the contact elements).

When using standard packages according to the prior art, one disadvantage is that the intermediate contact-making device (interposer) must be used since these are expensive and disadvantageously also result in a complex assembly process procedure.

SUMMARY OF THE INVENTION

One object of the present invention is therefore to overcome a predetermined arrangement of circuit units on a wafer, in which only functional circuit units whose connection contacts are separated by a distance which can be predetermined are transferred to a new wafer using a circuit unit transfer process.

According to the invention, this object is achieved by the method specified in patent claim 1. Further refinements of the invention can be found in the dependent claims.

One major idea of the invention is for the circuit units which are arranged on an original wafer to be separated by sawing, in order subsequently to arrange only functional circuit units on a modified wafer, with their connection contacts separated by a distance which can be predetermined.

One advantage of the present invention is that, after the processing procedure according to the invention, only functional circuit units need be wired up, thus saving costs and time.

After the end of the process according to the invention, a wafer is advantageously produced with known functional circuit units (known good wafer=KGW).

The method according to the invention for connection of circuit units essentially has the following steps:

a) a wafer on which the circuit units are arranged is fitted to a first film;

b) the wafer is sawn such that the circuit units which are arranged on the wafer are separated, advantageously resulting in the circuit units being separated by a distance equal to a saw blade width of about 50–100 $\mu$m;

c) functional circuit units are picked up by means of a handling device, once a previous test of the original wafer has already confirmed which of the circuit units on the original wafer are functional and which of the circuit units on the original wafer are defective; and d) the functional circuit units which have been picked up are placed down on a second film by means of the handling device, so as to produce a separation distance (pitch) which can be predetermined.

The circuit units can thus advantageously be arranged on a modified wafer such that it is possible to comply with a standard separation distance (standard pitch).

In this case, it is expedient that it is possible to provide connection contacts, arranged on a connection unit, outside the silicon area of a functional circuit unit.

The modified wafer advantageously has a standard size. A further advantage of the method according to the invention is that only functional circuit units are present.

Advantageous developments and improvements of the respective subject matter of the invention can be found in the dependent claims.

According to one preferred development of the present invention, a predetermined arrangement of circuit units on an original wafer is overcome in that a modified wafer is produced by means of the handling device, with a predetermined separation distance which, for example, matches a standard separation distance. A new wafer is thus created in an advantageous manner.

According to a further preferred development of the present invention, a modified wafer is created which has only functional circuit units. This advantageously avoids the processing of defective circuit units, which is unavoidable in the methods according to the prior art (for wafer level packages).

According to yet another preferred development of the present invention, a modified wafer is created, in which the distance between individual adjacent functional circuit units is greater. In particular, one advantage is that an arrangement of contact-making connections need no longer be accommodated exclusively underneath the surface of the corresponding circuit units but that a larger contact-making area is provided, particularly when there are a large number of connections.

According to yet another preferred development of the present invention, a lateral dimension change is produced in the modified wafer by incorporating at least one cutout between adjacent circuit units.

It is thus furthermore advantageous that the contact-making pressure which acts on the connection contacts and/or on the connection units is reduced by the at least one cutout when making contact with the functional circuit units which are obtained.

According to yet another preferred development of the present invention, the functional circuit units which are arranged on the modified wafer are encapsulated using an encapsulating compound. This advantageously results in the modified wafer being arranged in a robust manner.

According to yet another preferred development of the present invention, connection units are fitted to those surfaces of the functional circuit units which are not covered with the encapsulation compound, in which case connection units and connection contacts are advantageously not restricted to an area underneath the actual circuit unit which is to be fitted.

According to yet another preferred development of the present invention, connection contacts for connection of functional circuit units are arranged on the connection units with a separation distance which can be predetermined.

According to yet another preferred development of the present invention, the functional circuit units which are arranged on the modified wafer can be separated by sawing the modified wafer, in which case the functional circuit units are now advantageously surrounded by an encapsulation compound, and the connection units and connection contacts are separated by a modified, predetermined distance.

BRIEF DESCRIPTION OF THE DRAWINGS

Exemplary embodiments of the invention will be explained in more detail in the following description and are illustrated in the drawings, in which:

FIGS. 1a–1c show major steps (S1) to (S12) of the method according to the invention for connection of circuit units.

DETAILED DESCRIPTION OF THE INVENTION

Identical reference symbols denote identical or functionally identical components or steps in the figures.

In a step (S1), FIG. 1a shows an original wafer 100 which, in this example, contains individual circuit units 101a–101n (chips). A task which has already been carried out on this wafer has determined that individual circuit units are defective, in this exemplary embodiment identified by the circuit unit 101g.

A functional circuit unit is identified, for example, by the circuit unit 101d.

Finally, the processing using the method according to the invention progresses to a step (S2), which indicates how the original wafer 100 is fitted to a first film 102a. In the illustrated exemplary embodiment, this film is advantageously an adhesive film, thus producing an adhesively bonded joint between the wafer 100 and the first film 102a.

In a subsequent step (S3), the wafer is sawed such that the circuit units 101a–101n, including the defective circuit units 101g, which are arranged on the wafer are separated, with the sawing process typically producing a sawing gap with a width of 50–100 $\mu$m. In the step (S3) it is known which of the circuit units 101a–101n are functional, and which of the circuit units 101a–101n are defective.

With this knowledge, a subsequent step (S4) makes use of a handling device 103 to separate functional circuit units and defective circuit units. A second film 102b is provided for this purpose, whose characteristics are identical to those of the first film 102a. The handling device 103 picks up functional circuit units 101d from the first film 102a and places them on the second film 102b.

It should be noted that it is possible to place the functional circuit units 101d on the second film 102b with a different separation distance. This means that an original distance, governed by the saw blade width during sawing of the original wafer on the film 102a can be varied in order to produce a separation distance which can be predetermined, for example a standard separation distance, without any restriction to a silicon surface of a circuit unit.

The step (S4) itself achieves a first advantage of the method according to the invention, namely in that only functional circuit units are arranged on the second film 102b. A further advantage of the method according to the invention is that a contact separation which can be predetermined can be achieved. This contact separation can be predetermined virtually as required, and is set by using the handling device 103 for positioning.

FIG. 1b shows a further four method steps (S5) to (S8) according to the invention, which immediately follow the four method steps (S1) to (S4) in FIG. 1a.

The basic structure of a modified wafer 100a with only functional circuit units 101d is thus produced on the second film 102b in a subsequent step (S5).

A step (S6) illustrates how the cutouts 104 which are produced by sawing along a sawing line 108 can be used in order to set intermediate chip separations, that is to say distances between adjacent functional circuit units 101d, and thus advantageously to define a lateral dimension of the modified wafer.

Furthermore, the contact-making pressure which acts on the connection contacts 107 and/or on the connection units 106 is reduced by the at least one cutout 104 when making contact with the functional circuit units 101d which are obtained.

One main advantage of the method according to the invention can be seen in a step (S7) in which only functional circuit units 101d are provided with a package. Packaging of defective circuit units 101g is expediently avoided. A packaging process according to step (S7) consists of applying an encapsulation compound 105 to the upper face of the functional circuit units 101d which encapsulation compound 105 provides additional robustness for the entire arrangement of the modified wafer 100a.

In a subsequent step (S8) the second film 102b is removed, thus making the lower faces of the functional circuit units 101d accessible for contact to be made, with a contact-making process advantageously no longer being restricted, as in the prior art, to the lower faces of the circuit units, since a generally larger area is available for making contact as a result of the change in the distance between the circuit units.

FIG. 1c shows a further four method steps (S9) to (S12) according to the invention, which follow the method step (S8) shown in FIG. 1b.

As shown in FIG. 1c, step (S9), connection units 106 are fitted to the lower face of the functional circuit units 101d and project beyond the actual surface of the circuit unit into the intermediate space between individual, adjacent circuit units 101a–101n. Finally, in a subsequent step (S10), connection contacts 107 which are separated by a distance which can be predetermined are fitted to the connection units 106, which are fitted to the functional circuit units 101*d*. The increase in the surface area thus advantageously allows a greater number of connections for the relevant circuit unit to be accommodated.

Depending on the application, the functional circuit units 101*d* which are housed or packaged by means of the encapsulation compound 105 are then separated in a step (S11) so that, depending on the application, individual functional circuit units 101*d* or groups of functional circuit units 101*d* are produced. These circuit units are already provided with a package and with connection contacts separated by a distance which can be predetermined, as is shown in FIG. 1*c*, step (S12).

It is possible to see, in particular in step (S12) in FIG. 1*c*, that the connection contacts 107 which are arranged on the connection unit 106 can be provided outside the silicon area of the functional circuit unit 101*d*.

Although the present invention has been described above with reference to preferred exemplary embodiments, it is not restricted to these but can be modified in a wide range of ways.

What is claimed is:

1. A method for connection of circuit units, which are arranged on a wafer having the following steps:
   a) fitting the wafer to a first film;
   b) sawing the wafer such that the circuit units which are arranged on the wafer are separated;
   c) picking UP functional circuit units by means of a handling device;
   d) placing down the picked up functional circuit unit on a second film by means of the handling device; and
   e) creating a modified wafer, which has only functional circuit units and in which the distance between individual adjacent functional circuit units is greater as compared to the wafer, wherein connection contacts which are arranged on a connection unit are produced outside the silicon surface of the functional circuit unit such that a standard separation distance of the connection contacts is provided.

2. The method as claimed in claim 1, comprising producing a lateral dimension change in the modified wafer by incorporating at least one cutout.

3. The method as claimed in claim 1, comprising packaging the functional circuit units which are arranged on the modified wafer using an encapsulation compound.

4. The method as claimed in claim 1, comprising fitting connection units to those surfaces of the functional circuit units which are not covered with the encapsulation compound.

5. The method as claimed in claim 1, comprising arranging connection contacts for connection of the functional circuit units on the connection units.

6. The method as claimed in claim 1, comprising sawing the modified wafer to separate the functional circuit units which are arranged on the modified wafer.

7. The method as claimed in claim 1, the contact-making pressure which acts on the connection contacts and/or on the connection units is reduced by the at least one cutout when making contact with the functional circuit units which are obtained.

* * * * *